(12) United States Patent  
Barrass et al.

(10) Patent No.: US 9,369,176 B2  
(45) Date of Patent: Jun. 14, 2016

(54) DETECTION, CLASSIFICATION AND MUTUAL RECOGNITION OF 4 PAIR POWER OVER ETHERNET

(71) Applicant: Cisco Technology, Inc., San Jose, CA (US)

(72) Inventors: Hugh Barrass, Milpitas, CA (US); Anoop Vetteth, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 397 days.

(21) Appl. No.: 14/076,553

(22) Filed: Nov. 11, 2013

(65) Prior Publication Data

US 2015/0130269 A1     May 14, 2015

(51) Int. Cl.
*H04B 3/02* (2006.01)
*H02J 4/00* (2006.01)
*G06F 1/26* (2006.01)
*H04L 12/10* (2006.01)
*H04L 12/40* (2006.01)
*H04L 5/14* (2006.01)
*G01R 31/04* (2006.01)

(52) U.S. Cl.
CPC .. *H04B 3/02* (2013.01); *G06F 1/26* (2013.01); *H02J 4/00* (2013.01); *H04L 12/10* (2013.01); *H04L 12/40045* (2013.01); *G01R 31/041* (2013.01)

(58) Field of Classification Search
CPC .......................................................... H04L 5/14
USPC ............................................................ 307/85
See application file for complete search history.

(56) References Cited

U.S. PATENT DOCUMENTS 6,175,865 B1   1/2001   Dove et al.
2006/0078093 A1   4/2006   Karam et al.

FOREIGN PATENT DOCUMENTS

WO    2006/088745    8/2006

OTHER PUBLICATIONS

International Search Report and Written Opinion, dated Jan. 23, 2015, received in connection with International Application No. PCT/US2014/064985.

*Primary Examiner* — Robert Deberadinis
(74) *Attorney, Agent, or Firm* — Meunier Carlin & Curfman LLC

(57) ABSTRACT

A method for verifying interconnection of a PSE and PD with 4-pair PoE capabilities includes performing a first classification event on first and second pairs, respectively, and detecting a first predetermined class current on first and second sets of twisted pairs, respectively. The method includes performing a second classification event on first and second pairs, respectively, and detecting first and second predetermined class currents on first and second pairs, respectively. After expiration of a first variable delay period related to a first pseudo-random variable of the PSE, the method includes performing a third classification event on the first pair and detecting a first derived class current on the first pair. After expiration of a second variable delay period related to a second pseudo-random variable of the PD, the method includes performing the third classification event on the second pair and detecting a second derived class current on the second pair.

20 Claims, 6 Drawing Sheets

DETECTION, CLASSIFICATION AND MUTUAL RECOGNITION OF 4 PAIR POWER OVER ETHERNET

BACKGROUND

IEEE 802.3 defines two types of systems for delivering power over an Ethernet link. The original Power over Ethernet ("PoE") specification (i.e., IEEE 802.3af) governs the supply of up to approximately 15 W power from Power Sourcing Equipment ("PSE") (e.g., devices that source power over an Ethernet link) to Powered Devices ("PDs") (e.g., devices that sink power over an Ethernet link). The specification includes a mechanism that allows the PSE to detect that a compliant PD is present so that power is only enabled on the Ethernet link when a compliant PD is connected. Detection and classification of a Type 1 device (e.g., PSE or PD) can be accomplished using single classification state. An enhancement to the original PoE specification was defined to increase the power sourced up to approximately 30 W, as well as improving management through the use of higher level data exchanges. An important aspect of the specification for enhanced PoE ("PoE+") (i.e., IEEE 802.3at) was the mechanism by which the PSE can definitively detect an enhanced (i.e., Type 2) PD and by which an enhanced PD can definitively understand that it has been detected by an enhanced (i.e., Type 2) PSE. Mutual recognition is necessary before the Type 2 PSE can increase the power available or the Type 2 PD can increase the power drawn. The detection and classification mechanism is designed so that it can be implemented by simple or complex systems, including PSEs that include the data link interface (i.e., end-point PSEs) and PSEs that are inserted in the channel between the two data link partners (i.e., mid-span PSEs). For example, detection and classification of a Type 2 device (e.g., PSE or PD) can be accomplished using two classification states. Additionally, a link layer discovery protocol ("LLDP") can optionally be used to convey detailed power requirements.

In both the original and enhanced specifications for PoE, the power is delivered over 2 of the 4 twisted pairs in an Ethernet cable. According to these specifications, PSEs are forbidden to deliver power over all 4 twisted pairs and PDs are required to accept power over either set of twisted pairs but are not allowed to require power over all 4 twisted pairs simultaneously.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. While implementations will be described for detecting, classifying and mutually recognizing 4 pair PoE capabilities, it will become evident to those skilled in the art that the implementations are not limited thereto.

Overview

Systems, methods and devices for verifying interconnection of a PSE and a PD with 4 pair PoE capabilities are provided herein. In order to verify that both sets of twisted pairs (e.g., all 4 twisted pairs) are connected between link partners with 4 pair PoE capabilities (e.g., the same PSE and PD), the detection, classification and recognition mechanism can be coordinated between the two sets of twisted pairs. For example, the PSE can apply a sequence of signals that would not normally be applied by a Type 1 or Type 2 device, and the PD can return responses to the sequence of signals that would not normally be returned by a Type 1 or Type 2 device. This allows the link partners to mutually verify their ability to support of 4 pair PoE operations, e.g., delivering or accepting power over all 4 twisted pairs simultaneously.

Figure 1A:
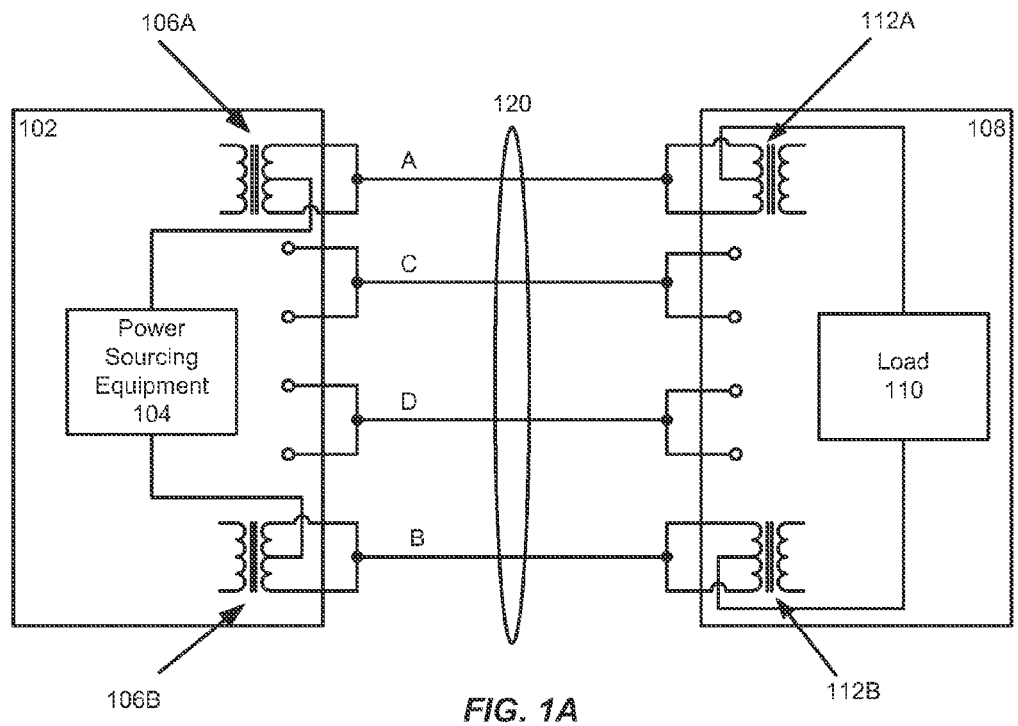
FIGS. 1A-1B are block diagrams illustrating systems for supplying electrical power in a PoE environment.
Figure 1B:
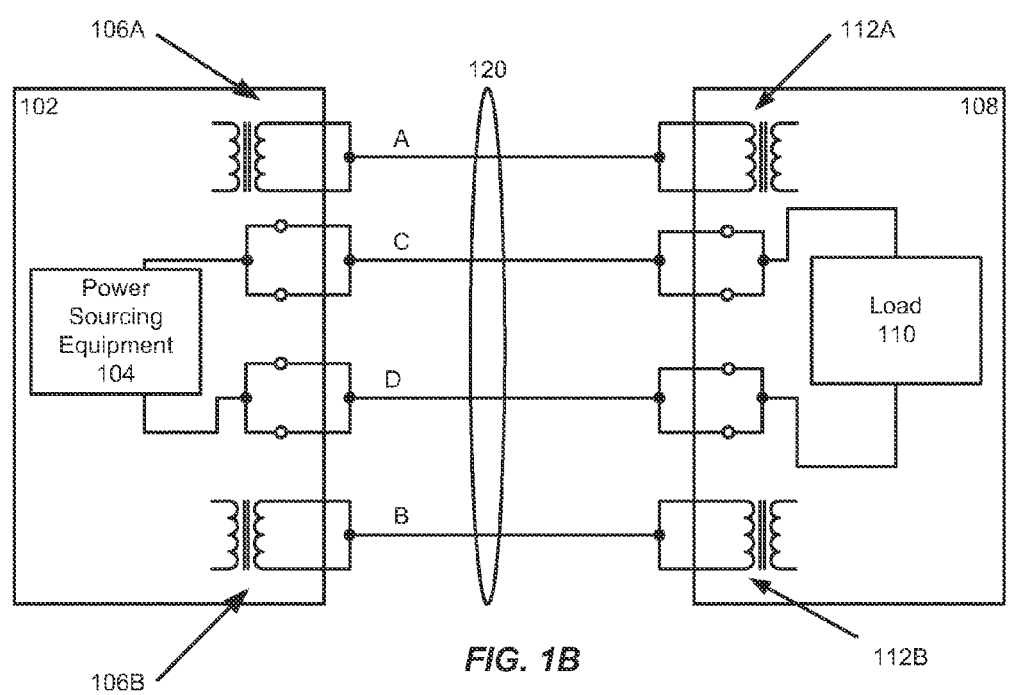

As described above, power is delivered over 2 of the 4 twisted pairs in an Ethernet cable in both the original and enhanced specifications for PoE. When twisted pairs A & B are used for power, the mechanism is designated as Mode A. This is shown in FIG. 1A, which is a block diagram illustrating a system for supplying electrical power in a PoE environment. In FIG. 1A, a network element 102 such as a switch, hub, router, gateway, etc., for example, is communicatively connected with a PD 108 through a communication link 120 (i.e., an Ethernet cable). The communication link 120 includes four twisted pairs A-D. The network element 102 includes an integral PSE 104. Electrical power is injected by the PSE 104 onto two data-carrying twisted pairs A & B through center-tapped transformers 106A, 106B and is conducted from center-tapped transformers 112A, 112B for use by a load 110 of the PD 108. The two non-data-carrying twisted pairs C & D are not used for communication or power transfer. When twisted pairs C & D are used for power, the mechanism is designated Mode B. This is shown in FIG. 1B, which is a block diagram illustrating another system for supplying electrical power in a PoE environment. FIG. 1B includes many of the same elements as FIG. 1A and these elements are not described in further detail below. In FIG. 1B, electrical power is injected by the PSE 104 onto the two non-data-carrying twisted pairs C & D and conducted for use by the load 110 of the PD 108. The two data-carrying twisted pairs A & B are not used for power transfer. Although FIGS. 1A-1B illustrate systems where only 2 of the 4 twisted pairs are used for data transfer (e.g., 10BASE-T, 100BASE-TX), it should be understood that PoE can be used in systems where all 4 twisted pairs are used for data transfer (e.g., 1000BASE-T, 10GBASE-T), for example, using a phantom technique. Additionally, although FIGS. 1A-1B illustrate systems where power is injected by an end-point PSE, it should also be understood that power can be injected by a mid-span PSE.

Example System

Figure 2:
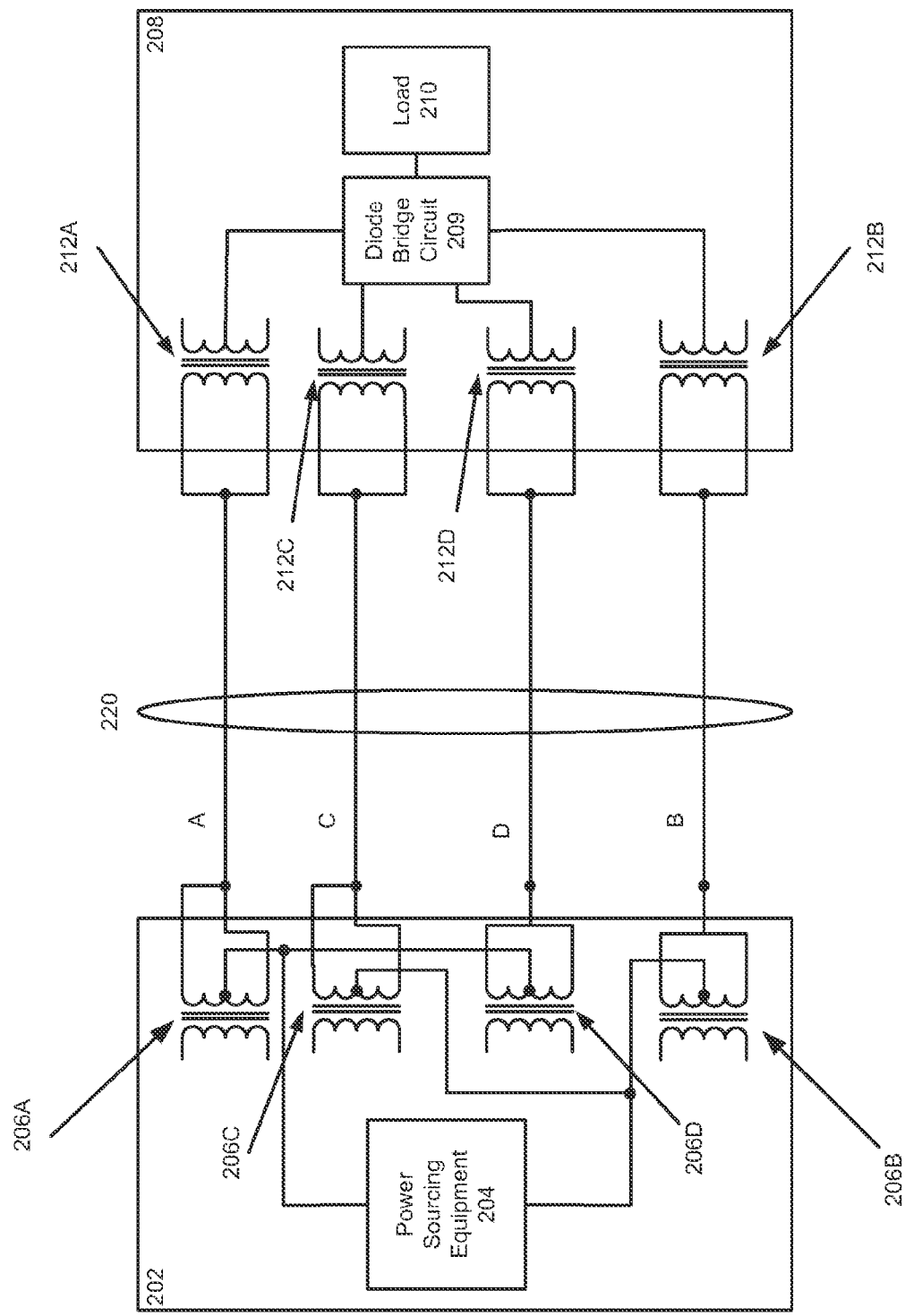
FIG. 2 is a block diagram of an example system for supplying electrical power in a PoE environment over 4 twisted pairs.

Referring now to FIG. 2, a block diagram of an example system for supplying electrical power in a PoE environment over 4 twisted pairs is shown. In FIG. 2, a network element 202 such as a switch, hub, router, gateway, etc., for example, is communicatively connected with a PD 208 through a communication link 220 (e.g., an Ethernet cable). The communication link 220 includes four twisted pairs A-D. The network element 202 includes an integral PSE 204. For example, the network element 202 is an end-point PSE. Additionally, communication is enabled on all 4 twisted pairs in FIG. 2 (e.g., 1000BASE-T, 10GBASE-T). In FIG. 2, electrical power is injected by the PSE 204 simultaneously onto two data-carrying twisted pairs A & B through center-tapped transformers 206A & 206B and two data-carrying twisted pairs C & D through center-tapped transformers 206C & 206D, respectively, to supply electrical power to the load 210 of the PD 208 through center-tapped transformers 212A, 212B, 212C and 212D. The load 210 accepts electrical power through one or more diode bridge circuits 209 (e.g., a pair of diode bridge circuits) such as full wave diode bridge type rectifier circuits, for example. It should be understood that the system illustrated in FIG. 2 is provided only as an example and that one of ordinary skill in the art may implement a PoE system with different configurations (e.g., more, less or alternative components) as compared to FIG. 2. For example, this disclosure contemplates using the techniques described herein in PoE systems where communication is enabled only on 2 of 4 twisted pairs. Alternatively or additionally, this disclosure contemplates using the techniques described herein in PoE systems with a mid-span PSE.

It may be desirable to provide systems where PoE power is simultaneously delivered over all 4 twisted pairs of an Ethernet link, for example, to increase the power sourced up to approximately 60 W or more. If such a system is developed, techniques will need to be developed to detect, classify and recognize compliant PSEs and PDs. In these types of PoE systems, the detection, classification and recognition mechanism can allow a compatible PSE (e.g., a PSE with 4 pair PoE capability) to determine that it is connected to a compatible PD (e.g., a PD with 4 pair PoE capability) before delivering power over all 4 twisted pairs simultaneously. Alternatively or additionally, the detection, classification and recognition mechanism can allow a compatible PD (e.g., a PD with 4 pair PoE capability) to determine that it is connected to a compatible PSE (e.g., a PSE with 4 pair PoE capability) before attempting to draw power over all 4 twisted pairs simultaneously. Optionally, the above determinations can be unequivocal determinations. As used herein, a PSE or PD with 4 pair PoE capability can be referred to as a Type 3 device.

As described above, in some PoE systems, communication may be enabled on less than all 4 twisted pairs, for example, on only 2 of 4 twisted pairs (e.g., on 10M, 100M and reduced pair Gigabit systems). It should be understood that when cable connectivity is designed for 2 pair operation, only 2 twisted pairs connect link partners (e.g., interconnected PSE and PD). Therefore, it is possible that the 4 twisted pairs connect one system (e.g., a PSE) to two different systems (e.g., two different PDs). The detection, classification and recognition mechanism can therefore optionally allow link partners to determine that all 4 twisted pairs are connected between the same PSE and PD before delivering/accepting power over all 4 twisted pairs.

Optionally, the detection, classification and recognition mechanism can be generally applicable such that it can be supported by devices that, by their nature, cannot or do not participate in data communication with a PD such as a mid-span PSE, for example. For example, the detection, classification and recognition mechanism can optionally be implemented without using the LLDP or other similar mechanism for exchanging data. Alternatively or additionally, the detection, classification and recognition mechanism can optionally be designed to be supported by a "dumb" PD such as a PD without more sophisticated communication capabilities.

In order to verify that both sets of twisted pairs (e.g., all 4 twisted pairs) are connected between link partners (e.g., the same Type 3 PSE and Type 3 PD), the detection, classification and recognition mechanism can be coordinated between the two sets of twisted pairs. For example, the Type 3 PSE can apply a sequence of signals that would not normally be applied by a Type 1 or Type 2 device, and the Type 3 PD can return responses to the sequence of signals that would not normally be returned by a Type 1 or Type 2 device. This allows the link partners to mutually verify their ability to support Type 3 operations, e.g., delivering or accepting power over all 4 twisted pairs simultaneously.

It should be appreciated that the logical operations described herein with respect to the various figures may be implemented (1) as a sequence of computer implemented acts or program modules (i.e., software) running on a computing device, (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

Figure 3:
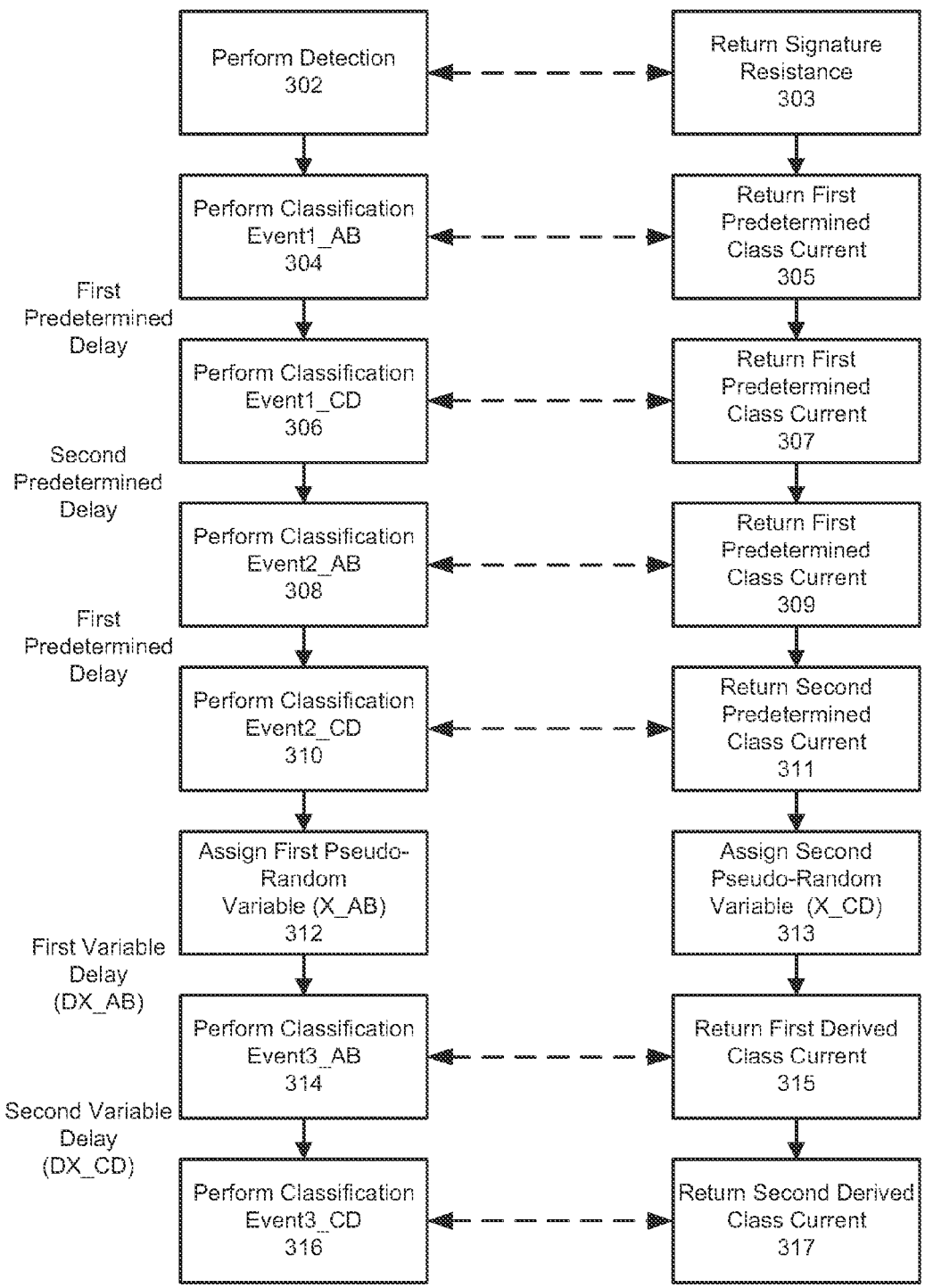
FIG. 3 is a state machine illustrating example operations for verifying interconnection of a PSE and PD with 4 pair PoE capabilities.

Referring now to FIG. 3, a state machine illustrating example operations for verifying interconnection of a PSE and PD with 4 pair PoE capabilities. The interconnected PSE and PD can optionally be network element 202 and PD 208 shown in FIG. 2, for example. Optionally, a number of steps in the state machine described below can be similar to Type 2 discovery and classification as defined in IEEE 802.3at, which allows for backward compatibility with Type 1 and Type 2 devices. For example, the PSE can optionally sequentially perform detection on twisted pairs A & B and then on twisted pairs C & D at 302. The PSE can optionally perform detection by applying a predetermined voltage (e.g., approximately 2-11 V) sequentially across twisted pairs A & B and then on twisted pairs C &D. At 303, the PD can provide, indicate or return a signature resistance (e.g., approximately 19-26 k$\Omega$), which can be detected by the PSE, for example, by measuring the current. Detecting the predetermined signature resistance provides an indication that a compliant PD is connected. If the predetermined signature resistance is not detected (e.g., detected resistance is not in the approximate range), PoE power is not applied. It should be understood that the predetermined voltage and signature resistance are provided only as examples and that other values can be used.

After optionally performing detection, the PSE can perform classification, for example, by performing a sequence of one or more classification events. Classification allows the PD to provide, indicate or return its power requirement, for example, by changing its sense resistance when a higher voltage is applied by the PSE. A classification event as used herein can include two phases—a classification phase and a mark phase. Each cycle including a classification phase and a mark phase is a "finger" as used herein. During the classification phase, the PSE can apply a classification voltage (e.g., approximately 14-21 V) and measure or detect a class current drawn by the PD. The PSE can decode the class current to determine the PD's power requirement. For example, different predetermined class currents or current ranges can be used to indicate different PD power requirements. Example predetermined class current ranges and PD power requirements are provided below in Table 1.

TABLE 1

| Class | Description | Class Current (mA) | Power Range (W) |
|---|---|---|---|
| 0 | Class not implemented | 0-4 | 0.44-12.94 |
| 1 | Very low power | 9-12 | 0.44-3.84 |
| 2 | Low power | 17-20 | 3.84-6.49 |
| 3 | Mid power | 26-30 | 6.49-12.95 |
| 4 | High power (e.g., Type 2) | 36-44 | 12.95-25.50 |

During the mark phase, the PSE can apply a mark voltage (e.g., approximately 7-10 V), which allows the PD to draw a minimal amount of power to maintain its state machine. This also provides an indication to the PD that the PSE has enhanced PoE capability. It should be understood that the classification and mark voltages, class currents, power ranges and classes are provided only as examples and that more, less and/or other values can be used.

At 304, the PSE can perform a first classification event ("Event1_AB") on a first plurality of twisted pairs such as pairs A & B, for example by applying a voltage across twisted pairs A & B. The PD can detect or measure the first classification event on the first twisted pairs. At 305, the PD can provide, indicate or return a first predetermined class current in response to the first classification event, which can be detected by the PSE by measuring or detecting the first predetermined class current. As described above, the PD can return a class current by changing its sense resistance to draw a particular current. The PSE can then decode the class current to determine the PD class (e.g., the power requirement). For example, the PD can return Class=4 by changing its sense resistance to draw 36-44 mA. It should be understood that returning Class=4 is standard behavior expected of a Type 2 PD.

At 306, the PSE can perform the first classification event ("Event1_CD") on a second plurality of twisted pairs such as pairs C & D, for example by applying a voltage across twisted pairs C & D. Optionally, the PSE can perform the first classification event on twisted pairs C & D after expiration of a first predetermined delay period (e.g., 3 ms or any other predetermined, fixed period of time). The PD can detect or measure the first classification event on the second twisted pairs. At 307, the PD can return the first predetermined class current (e.g., Class=4 by changing its sense resistance) in response to the first classification event, which can be detected by the PSE by measuring or detecting the first predetermined class current. Similar to above, the PSE can then decode the class current to determine the PD class. It should be understood that a Type 2 PD (or two, Type 2 PDs) might be expected to return Class=4. In the event that the PD fails to respond or responds with an unexpected class current (e.g., Class=0, 1, 2, or 3), the PSE can determine that the PD is not a Type 3 PD, i.e., the PD is not capable of accepting PoE power over all 4 twisted pairs. In this case, the PSE can optionally treat the PD as a Type 1 or Type 2 PD. Returning Class=4 as the first predetermined class current is provided only as an example and it is possible to return another predetermined Class value (e.g., Class=0, 1, 2, or 3). It should also be understood that the first classification events can optionally include application of the classification voltage and/or mark voltage described above.

Next, at 308, the PSE can perform a second classification event ("Event2_AB") on the first twisted pairs such as pairs A & B, for example by applying a voltage across twisted pairs A & B. Optionally, the PSE can perform the second classification event on twisted pairs A & B after expiration of a second predetermined delay period (e.g., 6 ms or any other predetermined, fixed period of time), which can optionally be different than the first predetermined delay period. The PD can detect or measure the second classification event on the first twisted pairs. At 309, the PD can return the first predetermined class current (e.g., Class=4 by changing its sense resistance) in response to the second classification event, which can be detected by the PSE by measuring or detecting the first predetermined class current. Similar to above, the PSE can then decode the class current to determine the PD class. It should be understood that returning Class=4 is standard behavior expected of a Type 2 PD.

At 310, the PSE can perform the second classification event ("Event2_CD") on the second twisted pairs such as pairs C & D, for example by applying a voltage across twisted pairs C & D. Optionally, the PSE can perform the second classification event on twisted pairs C & D after expiration of the first predetermined delay period (e.g., 3 ms or any other predetermined, fixed period of time). The PD can detect or measure the second classification event on the second twisted pairs. At 311, the PD can return a second predetermined class current in response to the second classification event, which can be detected by the PSE by measuring or detecting the second predetermined class current. Optionally, the second predetermined class current can be different than the first predetermined class current (e.g., Class=0, 1, 2, or 3). For example, the PD can return Class=1 by changing its sense resistance to draw 9-12 mA. Similar to above, the PSE can then decode the class current to determine the PD class. In the event that the PD fails to respond or responds with an unexpected class current (e.g., Class=0, 2, 3, or 4), the PSE can determine that the PD is not a Type 3 PD, i.e., the PD is not capable of accepting PoE power over all 4 twisted pairs. In this case, the PSE can optionally treat the PD as a Type 1 or Type 2 PD. Returning Class=1 as the second predetermined class current is provided only as an example and it is possible to return another predetermined Class value (e.g., a class value other than the first predetermined class value described above). Additionally, returning Class=1 is not a standard behavior expected of a Type 2 device. Instead, this disclosure contemplates that Type 3 devices (e.g., PSEs and PDs) can be configured to operate according to Steps 302-311, which aids in mutual detection, classification and recognition of interconnected Type 3 devices. However, there is a possibility that two PDs connected to one or more PSEs can independently respond according to Steps 302-311. Thus, as described in further detail below, the remaining steps in the state machine shown in FIG. 3 ensure that the same PSE is interconnected with the same PD over all 4 twisted pairs. It should be understood that the second classification events can optionally include application of the classification voltage and/or mark voltage described above.

The PSE and PD can respectively assign pseudo-random variables. Each of the pseudo-random variables can be assigned by randomly by the PSE and PD, respectively, during the process for verifying interconnection of a PSE and PD with 4 pair PoE capabilities. Optionally, each of the pseudo-random variables can be an integer, for example, an integer between 0 and 4. Optionally, the integer values can correspond to the Class values provided in Table 1. For example, the PSE can assign a first pseudo-random variable ("X_AB") at 312. Optionally, the first pseudo-random variable can be a value other than the Class value of the class current previously returned by the PD on the first twisted pairs such as pairs A &B (e.g., the first predetermined class current or Class=4). For example, the first pseudo-random variable can optionally have a value that is one of {0, 1, 2, or 3}. In other words, the first pseudo-random variable can have a value other than a Class value expected to be returned by a Type 2 PD in response to a classification event. Additionally, the PD can assign a second pseudo-random variable ("X_CD") at 313. Optionally, the second pseudo-random variable can be a value other than the Class value of the class current previously returned by the PD on the second twisted pairs such as pairs C &D (e.g., the second predetermined class current or Class=1). For example, the second pseudo-random variable can optionally have a value that is one of {0, 2, 3, or 4}. This disclosure also contemplates implementing the techniques described herein using integers and non-integers having values other than integers between 0 and 4 and/or the Class values provided in Table 1.

A first variable delay period ("DX_AB") can be established based on the value of the first pseudo-random variable ("X_AB"). Optionally, the length of the first variable delay period can be determined by the value of the first pseudo-random variable. For example, the first variable delay period can be defined according to Eqn. (1) below.

$$\text{First Variable Delay Period} = Y + Z \cdot X\_AB \quad (1)$$

Optionally, X=3 ms and Y=2 ms. It should be understood that Eqn. (1), as well as the values for Y and Z are provided only as examples and that other relationships between the first pseudo-random variable and the first variable delay period can be defined and/or other values for Y and Z can be used. At 314, after expiration of the first variable delay period, the PSE can perform a third classification event ("Event3_AB") on the first twisted pairs such as pairs A & B, for example by applying a voltage across twisted pairs A & B. The PD can detect or measure the third classification event on the first twisted pairs. At 315, the PD can return a first derived class current in response to the third classification event, which can be detected by the PSE by measuring or detecting the first derived class current. The PD can use the second pseudo-random variable to select the first derived class current. As described above, the PD can change the value of its sensing resistor to draw a desired class current. For example, if the second pseudo-random value is 3, the PD can change the value of its sensing resistor to draw 26-30 mA. Similar to above, the PSE can then decode the first derived class current to determine the second pseudo-random value assigned to the PD. It should be understood that this allows the PSE to learn/determine the second pseudo-random variable, which was randomly assigned by the PD.

A second variable delay period ("DX_CD") can be established based on the value of the second pseudo-random variable ("X_CD"). Optionally, the length of the second variable delay period can be determined by the value of the second pseudo-random variable. For example, the second variable delay period can be defined according to Eqn. (2) below.

$$\text{Second Variable Delay Period} = Y + Z \cdot X\_CD \quad (2)$$

Optionally, X=3 ms and Y=2 ms. It should be understood that Eqn. (2), as well as the values for Y and Z are provided only as examples and that other relationships between the second pseudo-random variable and the second variable delay period can be defined and/or other values for Y and Z can be used. At 316, after expiration of the second variable delay period, the PSE can perform the third classification event ("Event3_CD") on the second twisted pairs such as pairs C & D, for example by applying a voltage across twisted pairs C & D. The PD can decode or measure the length of the second variable delay period to confirm the value of the second pseudo-random variable. The PD can detect or measure the third classification event on the second twisted pairs. At 317, the PD can return a second derived class current in response to the third classification event, which can be detected by the PSE by measuring or detecting the second derived class current. If the second variable delay period matches the PD's expectation (e.g., the length is related to the second pseudo-random variable), the PD can return the second derived class current based on the first pseudo-random variable. For example, the PD can have optionally decoded or measured the length of the first variable delay period to determine the first pseudo-random variable assigned to the PSE. It should be understood that this allows the PD to learn/determine the first pseudo-random variable, which was randomly assigned by the PSE. The PD can then use the first pseudo-random variable to select the fourth class current, for example, by changing the value of its sensing resistor to draw a desired class current as described above. For example, if the first pseudo-random value is 2, the PD can change the value of its sensing resistor to draw 17-20 mA. Otherwise, if the second variable delay period does not match the PD's expectation (e.g., the length is not related to the second pseudo-random variable), the PD can return a class current not based on the first pseudo-random variable. It should be understood that this provides an indication that the same PSE is not connected to the same PD over all 4 twisted pairs. Similar to above, the PSE can then decode the second derived class current to confirm the first pseudo-random value assigned to the PSE. If the decoded second derived class current matches the first pseudo-random variable, then the PSE can supply power over all 4 twisted pairs simultaneously. Otherwise, if the decoded second derived class current does not match the first pseudo-random variable, then the PSE can enter an error state. The error state can prevent a PSE from providing current over 4 pairs or a PD from drawing current from 4 pairs in a mis-connected situation. It should be understood that this provides an indication that the same PSE is not connected to the same PD over all 4 twisted pairs. It should also be understood that the third classification events can optionally include application of the classification voltage and/or mark voltage described above.

Figure 4:
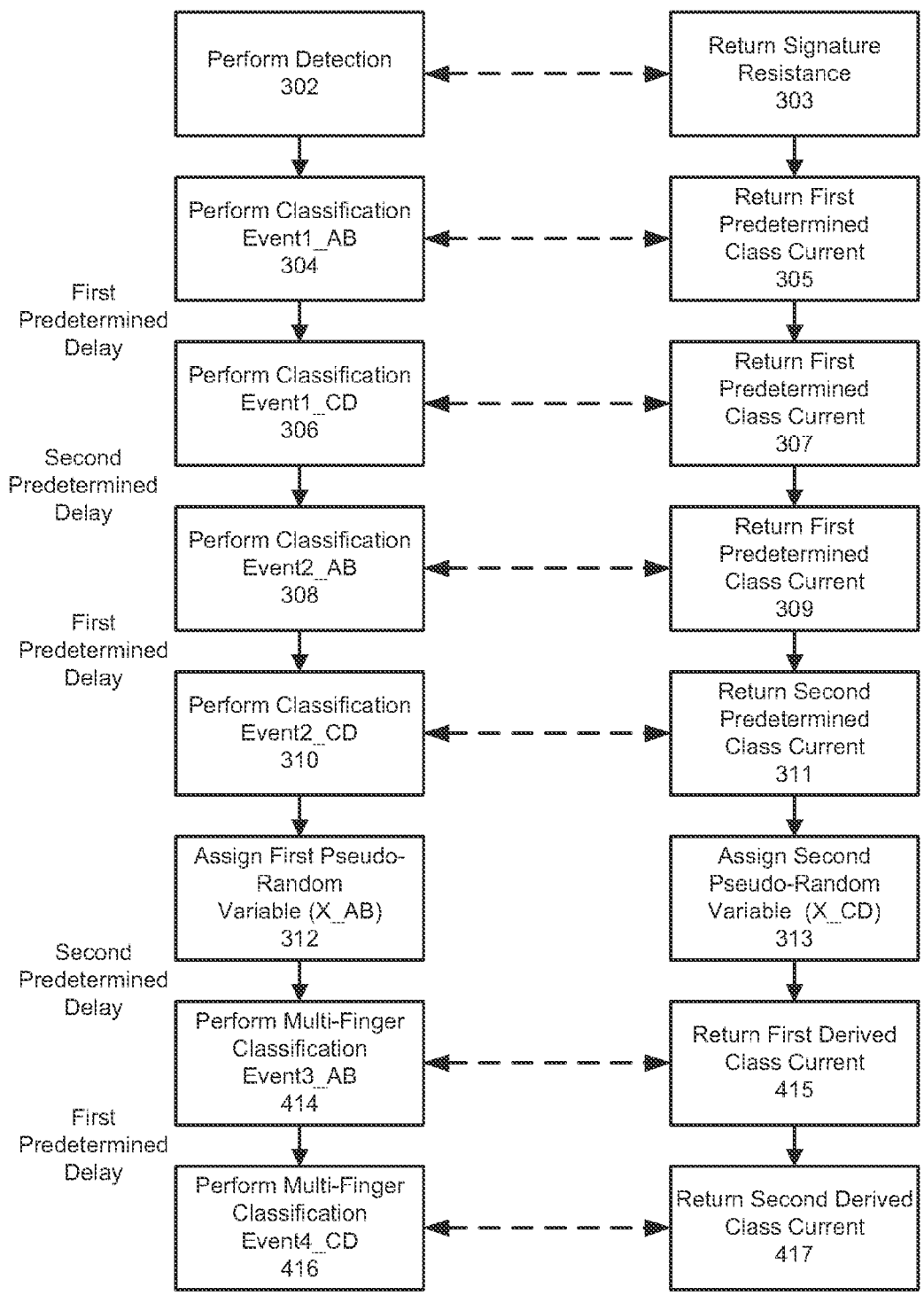
FIG. 4 is another state machine illustrating example operations for verifying interconnection of a PSE and PD with 4 pair PoE capabilities.

Referring now to FIG. 4, another state machine illustrating example operations for verifying interconnection of a PSE and PD with 4 pair PoE capabilities. The interconnected PSE and PD can optionally be network element 202 and PD 208 shown in FIG. 2, for example. Steps 302-313 are the same as steps 302-313 described with reference to FIG. 3 and are therefore not described in detail below. Unlike the example operations described with reference to FIG. 3, which are based on variable delay periods, the example operations described with reference to FIG. 4 are based on variable numbers of detection cycles (e.g., "fingers"). After assigning first and second pseudo-random variables at steps 312 and 313, respectively, the process continues to performing the third and fourth classification events as described below.

At 414, the PSE can perform a third classification event ("Event3_AB" or "Multi-Finger Classification Event Event3_AB") on the first twisted pairs such as pairs A & B, for example by applying a voltage across twisted pairs A & B. Optionally, the PSE can perform the third classification event on twisted pairs A & B after expiration of a second predetermined delay period (e.g., 6 ms or any other predetermined, fixed period of time), which can optionally be different than the first predetermined delay period. The third classification event can include a first variable number of detection cycles related to the first pseudo-random variable. For example, if the first pseudo-random variable is 2, the third classification event includes 2 detection cycles. The PD can detect or measure the third classification event on the first twisted pairs. At 415, the PD can return a first derived class current in response to the third classification event, which can be detected by the PSE by measuring or detecting the first derived class current. The PD can use the second pseudo-random variable to select the first derived class current. As described above, the PD can change the value of its sensing resistor to draw a desired class current. For example, if the second pseudo-random value is 3, the PD can change the value of its sensing resistor to draw 26-30 mA. Similar to above, the PSE can then decode the first derived class current to determine the second pseudo-random value assigned to the PD. It should be understood that this allows the PSE to learn/determine the second pseudo-random variable, which was randomly assigned by the PD.

At 416, the PSE can perform a fourth classification event ("Event4_CD" or "Multi-Finger Classification Event Event4_CD") on the second twisted pairs such as pairs C & D, for example by applying a voltage across twisted pairs C & D. Optionally, the PSE can perform the fourth classification event on twisted pairs C & D after expiration of the first predetermined delay period (e.g., 3 ms or any other predetermined, fixed period of time). The fourth classification event can include a second variable number of detection cycles related to the second pseudo-random variable. The PD can decode or measure the second variable number of detection cycles to confirm the value of the second pseudo-random variable. The PD can detect or measure the fourth classification event on the second twisted pairs. At 417, the PD can return a second derived class current in response to the third classification event, which can be detected by the PSE by measuring or detecting the first derived class current. If the second variable number of detection cycles matches the PD's expectation (e.g., the variable number of detection cycles is related to the second pseudo-random variable), the PD can return the second derived class current based on the first pseudo-random variable. For example, the PD can have optionally decoded or measured the first variable number of detection cycles to determine the first pseudo-random variable assigned to the PSE. It should be understood that this allows the PD to learn/determine the first pseudo-random variable, which was randomly assigned by the PSE. The PD can then use the first pseudo-random variable to select the fourth class current, for example, by changing the value of its sensing resistor to draw a desired class current as described above. For example, if the first pseudo-random value is 2, the PD can change the value of its sensing resistor to draw 17-20 mA. Otherwise, if the second variable number of detection cycles does not match the PD's expectation (e.g., the variable number of detection cycles is not related to the second pseudo-random variable), the PD can return a class current not based on the first pseudo-random variable. It should be understood that this provides an indication that the same PSE is not connected to the same PD over all 4 twisted pairs. Similar to above, the PSE can then decode the second derived class current to confirm the first pseudo-random value assigned to the PSE. If the decoded second derived class current matches the first pseudo-random variable, then the PSE can supply power over all 4 twisted pairs simultaneously. Otherwise, if the decoded second derived class current does not match the first pseudo-random variable, then the PSE can enter an error state. The error state can prevent a PSE from providing current over 4 pairs or a PD from drawing current from 4 pairs in a mis-connected situation. It should be understood that this provides an indication that the same PSE is not connected to the same PD over all 4 twisted pairs.

Figure 5:
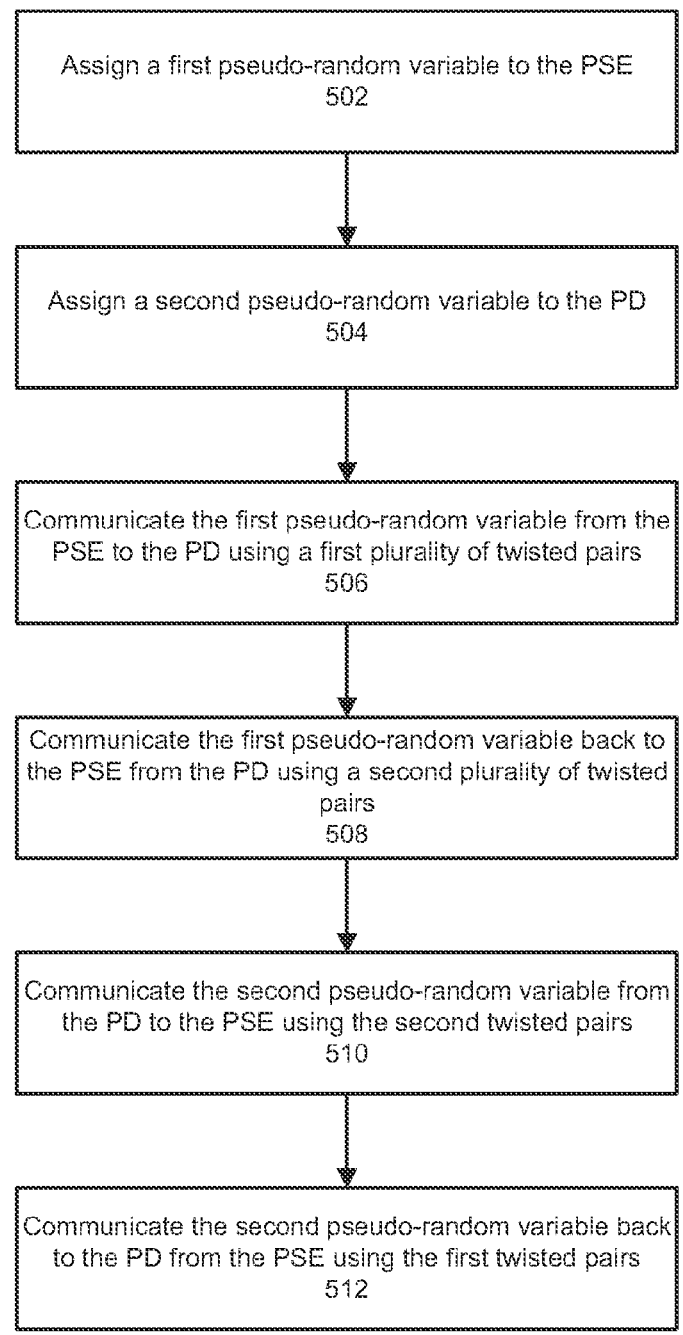
FIG. 5 is another state machine illustrating example operations for verifying interconnection of a PSE and PD with 4 pair PoE capabilities.

Referring now to FIG. 5, another state machine illustrating example operations for verifying interconnection of a PSE and PD with 4 pair PoE capabilities. The interconnected PSE and PD can optionally be network element 202 and PD 208 shown in FIG. 2, for example. At 502, a first pseudo-random variable is assigned to the PSE. At 504, a second pseudo-random variable is assigned to the PD. The first and second pseudo-random variables can optionally determine the variable delay periods used in the classification event sequence described with regard to FIG. 3 and/or the variable number of detection cycles used in the classification event sequence described with regard to FIG. 4, for example. At 506, the first pseudo-random variable can be communicated from the PSE to the PD using a first plurality of twisted pairs such as twisted pairs A & B, for example. Then, at 508, the first pseudo-random variable can be communicated back to the PSE from the PD using a second plurality of twisted pairs such as twisted pairs C & D, for example, in response to communicating the first pseudo-random variable from the PSE to the PD using the first twisted pairs such as twisted pairs A & B, for example. The first pseudo-random variable can optionally be communicated between the PSE and the PD through the classification event sequences described with regard to FIGS. 3 and/or 4. Optionally, the first pseudo-random variable can be decoded at the PD as described with regard to FIGS. 3 and/or 4.

At 510, the second pseudo-random variable can be communicated from the PD to the PSE using the second twisted pairs such as twisted pairs C & D, for example. Then, at 512, the second pseudo-random variable can be communicated back to the PD from the PSE using the first twisted pairs such as twisted pairs A & B, for example, in response to communicating the second pseudo-random variable from the PD to the PSE using the second twisted pairs such as twisted pairs C & D, for example. Optionally, steps 510 and 512 can be performed before, after or simultaneously with steps 506 and 508. Similar as described above, the second pseudo-random variable can optionally be communicated between the PSE and the PD through the classification event sequences described with regard to FIGS. 3 and/or 4. Optionally, the second pseudo-random variable can be decoded at the PSE as described with regard to FIGS. 3 and/or 4. This disclosure also contemplates using other mechanisms for communicating the states of the first and second pseudo-random variables between the PSE and the PD using all 4 twisted pairs (e.g., the first twisted pairs such as twisted pairs A & B and the second twisted pairs such as twisted pairs C & D) in a manner to prove unequivocally to both the PSE and the PD that 4 twisted pairs are connected between them. Power can be supplied from the PSE to the PD under the condition that the first pseudo-random variable is successfully communicated back to the PSE from the PD and the second pseudo-random variable is successfully communicated back to the PD from the PSE. It should be understood that this provides an indication that the same PSE is connected to the same PD over all 4 twisted pairs. Otherwise, an error state can be entered by the PSE and/or PD under the condition that the first pseudo-random variable is not successfully communicated back to the PSE from the PD or the second pseudo-random variable is not successfully communicated back to the PD from the PSE. It should be understood that this provides an indication that the same PSE is not connected to the same PD over all 4 twisted pairs.

Figure 6:
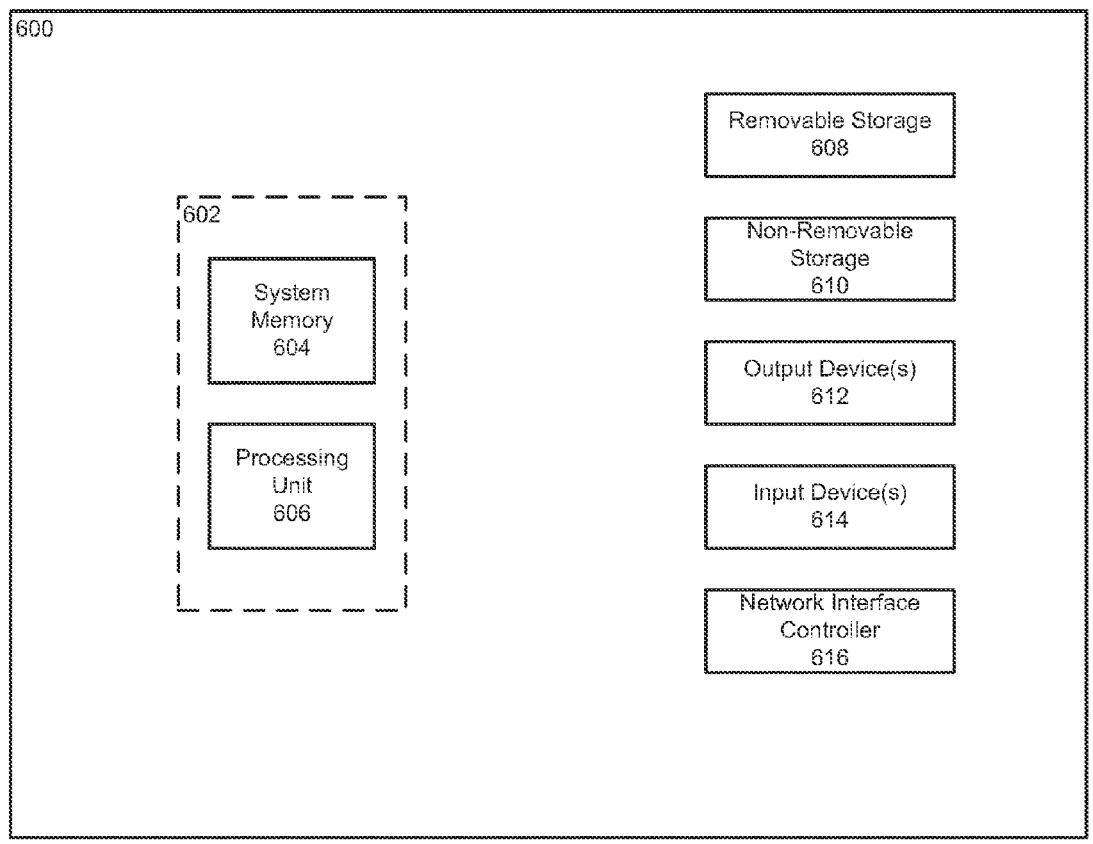
FIG. 6 is a block diagram illustrating an example computing device.

When the logical operations described herein are implemented in software, the process may execute on any type of computing architecture or platform. For example, referring to FIG. 6, an example computing device upon which embodiments of the invention may be implemented is illustrated. It should be understood that an example computing device can be included the PSE and the PD. The computing device 600 may include a bus or other communication mechanism for communicating information among various components of the computing device 600. In its most basic configuration, computing device 600 typically includes at least one processing unit 606 and system memory 604. Depending on the exact configuration and type of computing device, system memory 604 may be volatile (such as random access memory (RAM)), non-volatile (such as read-only memory (ROM), flash memory, etc.), or some combination of the two. This most basic configuration is illustrated in FIG. 6 by dashed line 602. The processing unit 606 may be a standard programmable processor that performs arithmetic and logic operations necessary for operation of the computing device 600.

Computing device 600 may have additional features/functionality. For example, computing device 600 may include additional storage such as removable storage 608 and non-removable storage 610 including, but not limited to, magnetic or optical disks or tapes. Computing device 600 may also contain network connection(s) 616 that allow the device to communicate with other devices. Computing device 600 may also have input device(s) 614 such as a keyboard, mouse, touch screen, etc. Output device(s) 612 such as a display, speakers, printer, etc. may also be included. The additional devices may be connected to the bus in order to facilitate communication of data among the components of the computing device 600. All these devices are well known in the art and need not be discussed at length here.

The processing unit 606 may be configured to execute program code encoded in tangible, computer-readable media. Computer-readable media refers to any media that is capable of providing data that causes the computing device 600 (i.e., a machine) to operate in a particular fashion. Various computer-readable media may be utilized to provide instructions to the processing unit 606 for execution. Common forms of computer-readable media include, for example, magnetic media, optical media, physical media, memory chips or cartridges, a carrier wave, or any other medium from which a computer can read. Example computer-readable media may include, but is not limited to, volatile media, non-volatile media and transmission media. Volatile and non-volatile media may be implemented in any method or technology for storage of information such as computer readable instructions, data structures, program modules or other data and common forms are discussed in detail below. Transmission media may include coaxial cables, copper wires and/or fiber optic cables, as well as acoustic or light waves, such as those generated during radio-wave and infra-red data communication. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 606 may execute program code stored in the system memory 604. For example, the bus may carry data to the system memory 604, from which the processing unit 606 receives and executes instructions. The data received by the system memory 604 may optionally be stored on the removable storage 608 or the non-removable storage 610 before or after execution by the processing unit 606.

Computing device 600 typically includes a variety of computer-readable media. Computer-readable media can be any available media that can be accessed by device 600 and includes both volatile and non-volatile media, removable and non-removable media. Computer storage media include volatile and non-volatile, and removable and non-removable media implemented in any method or technology for storage of information such as computer readable instructions, data structures, program modules or other data. System memory 604, removable storage 608, and non-removable storage 610 are all examples of computer storage media. Computer storage media include, but are not limited to, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 600. Any such computer storage media may be part of computing device 600.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for verifying interconnection of a power sourcing equipment ("PSE") and a powered device ("PD") with 4 pair power over Ethernet ("PoE") capabilities using the PSE, comprising:
performing a first classification event on a first plurality of twisted pairs and detecting a first predetermined class current on the first twisted pairs in response to the first classification event;
performing the first classification event on a second plurality of twisted pairs and detecting the first predetermined class current on the second twisted pairs in response to the first classification event;
performing a second classification event on the first twisted pairs and detecting the first predetermined class current on the first twisted pairs in response to the second classification event;
performing the second classification event on the second twisted pairs and detecting a second predetermined class current on the second twisted pairs in response to the second classification event, wherein the second predetermined class current is different than the first predetermined class current;
assigning a first pseudo-random variable to the PSE;
after expiration of a first variable delay period that is related to the first pseudo-random variable, performing a third classification event on the first twisted pairs and detecting a first derived class current on the first twisted pairs in response to the third classification event; and
after expiration of a second variable delay period that is related to a second pseudo-random variable assigned to the PD, performing the third classification event on the second twisted pairs and detecting a second derived class current on the second twisted pairs in response to the third classification event.

2. The method of claim 1, wherein the first and second pseudo-random variables are integers and values of the respective integers determine lengths of the first and second variable delay periods, respectively.

3. The method of claim 1, further comprising:
decoding the first derived class current to determine the second pseudo-random variable assigned to the PD; and
using the second pseudo-random variable to determine a length of the second variable delay period.

4. The method of claim 1, further comprising decoding the second derived class current to confirm the first pseudo-random variable assigned to the PSE.

5. The method of claim 4, further comprising supplying power to the first twisted pairs and second twisted pairs if the decoded second derived class current matches the first pseudo-random variable.

6. The method of claim 4, further comprising entering an error state if the decoded second derived class current does not match the first pseudo-random variable.

7. The method of claim 1, further comprising waiting for a first predetermined delay period to expire between sequentially performing the first classification event on the first twisted pairs and second twisted pairs or sequentially performing the second classification event on the first twisted pairs and second twisted pairs.

8. The method of claim 1, further comprising waiting for a second predetermined delay period to expire between sequentially performing the first classification event on the second twisted pairs and the second classification event on the first twisted pairs.

9. The method of claim 1, further comprising:
decoding the first variable delay period at the PD to determine the first pseudo-random variable assigned to the PSE; and
using the first pseudo-random variable to provide the second derived class current on the second twisted pairs in response to the third classification event.

10. A method for verifying interconnection of a power sourcing equipment ("PSE") and a powered device ("PD") with 4 pair power over Ethernet ("PoE") capabilities using the PSE, comprising:
performing a first classification event on a first plurality of twisted pairs and detecting a first predetermined class current on the first twisted pairs in response to the first classification event;
performing the first classification event on a second plurality of twisted pairs and detecting the first predetermined class current on the second twisted pairs in response to the first classification event;
performing a second classification event on the first twisted pairs and detecting the first predetermined class current on the first twisted pairs in response to the second classification event;
performing the second classification event on the second twisted pairs and detecting a second predetermined class current on the second twisted pairs in response to the second classification event, wherein the second predetermined class current is different than the first predetermined class current;
assigning a first pseudo-random variable to the PSE;
performing a third classification event on the first twisted pairs and detecting a first derived class current on the first twisted pairs in response to the third classification event, wherein the third classification event comprises a first variable number of detection cycles related to the first pseudo-random variable; and
performing a fourth classification event on the second twisted pairs and detecting a second derived class current on the second twisted pairs in response to the fourth classification event, wherein the fourth classification event comprises a second variable number of detection cycles related to a second pseudo-random variable assigned to the PD.

11. The method of claim 10, wherein the first and second pseudo-random variables are integers and values of the respective integers determine the first and second variable numbers of detection cycles, respectively.

12. The method of claim 10, further comprising:
decoding the first derived class current to determine the second pseudo-random variable assigned to the PD; and
using the second pseudo-random variable to determine the second variable number of detection cycles.

13. The method of claim 10, further comprising decoding the second derived class current to confirm the first pseudo-random variable assigned to the PSE.

14. The method of claim 13, further comprising supplying power to the first twisted pairs and second twisted pairs using the PSE if the decoded second derived class current matches the first pseudo-random variable.

15. The method of claim 10, further comprising:
decoding the first variable number of detection cycles at the PD to determine the first pseudo-random variable assigned to the PSE; and using the first pseudo-random variable to provide the second derived class current on the second twisted pairs in response to the fourth classification event.

16. A method for verifying interconnection of a power sourcing equipment ("PSE") and a powered device ("PD") with 4 pair power over Ethernet ("PoE") capabilities, comprising:
assigning a first pseudo-random variable to the PSE;
assigning a second pseudo-random variable to the PD;
communicating the first pseudo-random variable from the PSE to the PD using a first plurality of twisted pairs;
in response to communicating the first pseudo-random variable from the PSE to the PD, communicating the first pseudo-random variable back to the PSE from the PD using a second plurality of twisted pairs;
communicating the second pseudo-random variable from the PD to the PSE using the second twisted pairs; and
in response to communicating the second pseudo-random variable from the PD to the PSE, communicating the second pseudo-random variable back to the PD from the PSE using the first twisted pairs.

17. The method of claim 16, further comprising decoding the first pseudo-random variable at the PD.

18. The method of claim 16, further comprising decoding the second pseudo-random variable at the PSE.

19. The method of claim 16, further comprising supplying power from the PSE to the PD under the condition that the first pseudo-random variable is communicated back to the PSE from the PD and the second pseudo-random variable is communicated back to the PD from the PSE.

20. The method of claim 16, further comprising entering an error state under the condition that the first pseudo-random variable is not communicated back to the PSE from the PD or the second pseudo-random variable is not communicated back to the PD from the PSE.

* * * * *